US010826495B2

(12) United States Patent
Todescato et al.

(10) Patent No.: US 10,826,495 B2
(45) Date of Patent: Nov. 3, 2020

(54) ON CABLE TOUCHPAD FOR CONFIGURING AN ELECTRONIC DEVICE

(71) Applicant: Datalogic IP Tech S.R.L., Calderara di Reno, Bologna (IT)

(72) Inventors: Pietro Todescato, Eugene, OR (US); Davide Bruni, Bologna (IT); Fabio Albanese, Bologna (IT)

(73) Assignee: Datalogic IP Tech S.R.L., Bologna (IT)

( * ) Notice: Subject to any disclaimer, the term of this patent is extended or adjusted under 35 U.S.C. 154(b) by 0 days.

(21) Appl. No.: 15/764,727

(22) PCT Filed: Sep. 30, 2015

(86) PCT No.: PCT/IT2015/000246
§ 371 (c)(1),
(2) Date: Mar. 29, 2018

(87) PCT Pub. No.: WO2017/056119
PCT Pub. Date: Apr. 6, 2017

(65) Prior Publication Data
US 2018/0287606 A1    Oct. 4, 2018

(51) Int. Cl.
*H03K 17/96*       (2006.01)
*G06F 3/044*       (2006.01)
(Continued)

(52) U.S. Cl.
CPC .......... *H03K 17/962* (2013.01); *G06F 3/044* (2013.01); *G06F 3/0488* (2013.01); *H01B 7/04* (2013.01);
(Continued)

(58) Field of Classification Search
CPC ...... H03K 17/962; H03K 2217/960755; G06F 3/044; G06F 3/0488; H01B 7/04;
(Continued)

(56) References Cited

U.S. PATENT DOCUMENTS 3,819,370 A  *  6/1974  Komiya ............. B29C 63/0069
                                                     430/67
4,379,287 A     4/1983  Tyler et al.
(Continued)

FOREIGN PATENT DOCUMENTS

CN          101102337 A      1/2008
CN          201766569        3/2011
(Continued)

*Primary Examiner* — Anthony R Jiminez
(74) *Attorney, Agent, or Firm* — Foley & Lardner, LLP

(57) ABSTRACT

A flexible cable may include an electrical conductor, a dielectric insulator layer surrounding the electrical conductor, a jacket layer being flexible and surrounding the dielectric insulator layer, a shield surrounding the dielectric insulator layer and a connector electrically connected to the electrical conductor. The connector may be configured to connect to an electronic device and communicate electrical signals from the electrical conductor to the electronic device. The cable may further include a capacitive layer engaging the jacket layer. At least one capacitive pad may be disposed on the capacitive layer and be configured to communicate signals (e.g., capacitance variance) over a communications path in response to a user touching the capacitive pad(s) by his or her fingers.

19 Claims, 6 Drawing Sheets

(51) Int. Cl.
*G06F 3/0488* (2013.01)
*H01B 7/04* (2006.01)
*H01L 27/32* (2006.01)

(52) U.S. Cl.
CPC ............... *H01L 27/323* (2013.01); *H03K 2217/960755* (2013.01); *H03K 2217/960765* (2013.01)

(58) Field of Classification Search
CPC . H01B 9/00; H01B 9/02; H01B 11/00; H01B 5/00; H01B 5/02; H01B 5/06; H01B 5/08; H01B 5/10; H01B 5/12; H01B 5/16; H01L 27/323
USPC ........................................................ 200/600
See application file for complete search history.

(56) References Cited

U.S. PATENT DOCUMENTS

| | | | | |
|---|---|---|---|---|
| 4,741,041 A * | 4/1988 | Hayashi | ............. | H05K 9/00 |
| | | | | 174/36 |
| 7,324,779 B2 * | 1/2008 | Anderson | ......... | G03G 15/2014 |
| | | | | 399/341 |
| 7,449,631 B2 * | 11/2008 | Lee | ............. | H01B 11/1817 |
| | | | | 174/102 R |
| 7,756,988 B2 * | 7/2010 | Macdonald | ......... | H04W 4/021 |
| | | | | 709/229 |
| 8,018,605 B2 * | 9/2011 | Lapstun | ............. | G03G 15/6538 |
| | | | | 358/1.12 |
| 8,884,901 B2 * | 11/2014 | Landau | ............. | H03K 17/962 |
| | | | | 178/18.01 |
| 2008/0190528 A1 * | 8/2008 | Steinberg | ............. | H01H 9/0242 |
| | | | | 150/165 |
| 2010/0048135 A1 * | 2/2010 | Marten | ............. | H04R 1/1041 |
| | | | | 455/41.3 |
| 2013/0207715 A1 | 8/2013 | Salo et al. | | |
| 2014/0305930 A1 * | 10/2014 | Heizer | ............. | G08C 17/02 |
| | | | | 219/539 |
| 2014/0355782 A1 | 12/2014 | Hankey et al. | | |
| 2016/0295058 A1 * | 10/2016 | Yoshihara | ......... | H04N 1/00994 |

FOREIGN PATENT DOCUMENTS

| | | |
|---|---|---|
| EP | 2388787 A1 | 11/2011 |
| JP | 2001103578 A | 4/2001 |
| JP | 2008 130366 A | 6/2008 |
| WO | 2015100846 A1 | 7/2015 |

* cited by examiner

ON CABLE TOUCHPAD FOR CONFIGURING AN ELECTRONIC DEVICE

RELATED APPLICATIONS

This Application is a 371 National Stage Application of International Application No. PCT/IT2015/000246, filed Sep. 30, 2015, which is hereby incorporated by reference in its entirety.

BACKGROUND

Electronic devices that have very small enclosures, such as optical scanning systems and optoelectronic sensors, typically have a configuration setup feature for configuring the devices. Such configuration setup features, however, are difficult to provide for using conventional mechanical switches, such as DIP switches or other mechanical switches, on the electronic device due to the very small enclosures. Integrating such mechanical switches into the houses of the electronic devices often requires larger housings than desired to meet the stringent physical constraints by manufacturers of larger systems in which the electronic devices are integrated. Examples of such electronic devices include Keyence SR-1000, Datalogic DS1500, and Datalogic P-Series electronic devices. Accordingly, there is a need to provide for configuration settings while maintaining minimum sized houses.

SUMMARY

To provide for the ability to provide configuration settings for very small electronic devices, a cable or cable adapter may include integrated capacitive pads that enable a user to press the pads to communicate configuration signals to the electronic devices. A communications path between the capacitor pads and the electronic device may be provided to communicate signals responsive to a user touching the capacitive pads to the electronic device for configuration thereof.

One embodiment of a flexible cable may include an electrical conductor, a dielectric insulator layer surrounding said electrical conductor, a shield surrounding the dielectric insulator layer, a jacket layer being flexible and surrounding said dielectric insulator layer, and a connector electrically connected to the electrical conductor. The connector may be configured to connect to an electronic device and communicate electrical signals from the electrical conductor to the electronic device. The cable may further include a capacitive layer engaging the jacket layer. At least one capacitive pad may be disposed on the capacitive layer and be configured to communicate signals over a communications path in response to a user touching the capacitive pad(s) by his or her fingers. The signals may be capacitive variance responsive to the user touching the capacitive pad(s).

One embodiment of a method for forming a flexible cable may include forming an electrical cable inclusive of an electrical conductor, insulator, and shield, applying a sleeve to the electrical cable, where the sleeve may include buttons and a communications path for communicating signals from the buttons, and attaching a connector to the electrical cable.

One embodiment of a method for manufacturing an electronic device may include providing an electronic device having configurable settings, and be inclusive of a communications path for receiving a configuration signal to configure the electronic device, enclosing the electronic circuit in a housing, and providing a cable inclusive of one or more buttons that communicate configuration signals via the communications path to configure the electronic device.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION OF THE DRAWINGS

Figure 1:
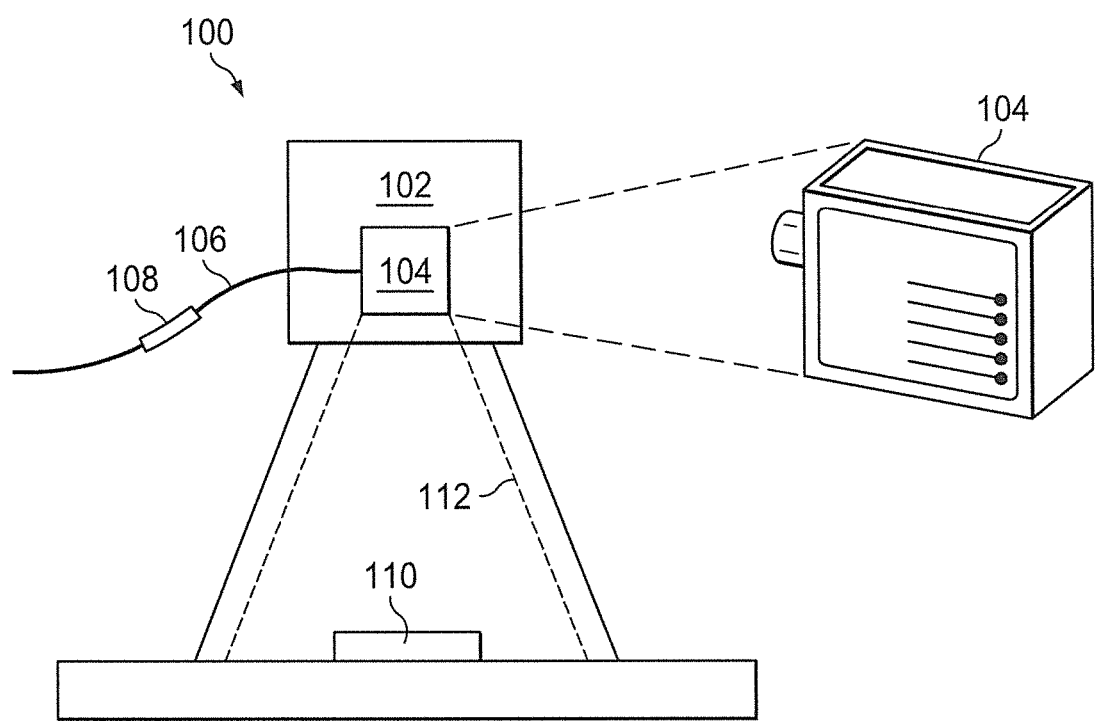
FIG. 1 is an illustration of an illustrative imaging system inclusive of an electronic device, in this case an imaging device, inclusive of a cable having configuration buttons or pads disposed thereon for configuring the electronic device.

With regard to FIG. 1, an illustration of an illustrative imaging system 100 inclusive of a sub-system 102 with an electronic device 104, in this case an imaging device, and a cable 106 having configuration buttons 108 for configuring the electronic device 104 disposed thereon is shown. The electronic device 104 may be an imaging device, such as a Datalogic DS1500, Datalogic P-Series, Keyence SR-700, Keyence SR-1000, or other imaging devices that are configured to be very small such that mechanical switches are difficult or not possible to integrate with the imaging electronic device 104. The imaging system 100 may be configured to image an object 110 positioned in a field-of-view 112 of the electronic device 104 for capturing an image of the object 110. The cable 106 may be a flexible cable, and be connected directly or indirectly with the electronic device so that a user of the system 100 may configure the electronic device by operating the configuration buttons 108 on the cable 106. Although the buttons 108 are shown as being an enlargement of the cable in that region, it should be understood that the buttons 108 may be integrated with the cable (e.g., deposited on an external layer) such that the enlarged area inclusive of buttons 108 as shown is not actually pronounced. As further described herein, the configuration buttons 108 may be capacitive buttons that is responsive to human fingers to generate a capacitance signal for causing a change in capacitance value of a value associated with the configuration buttons 108.

Figure 2:
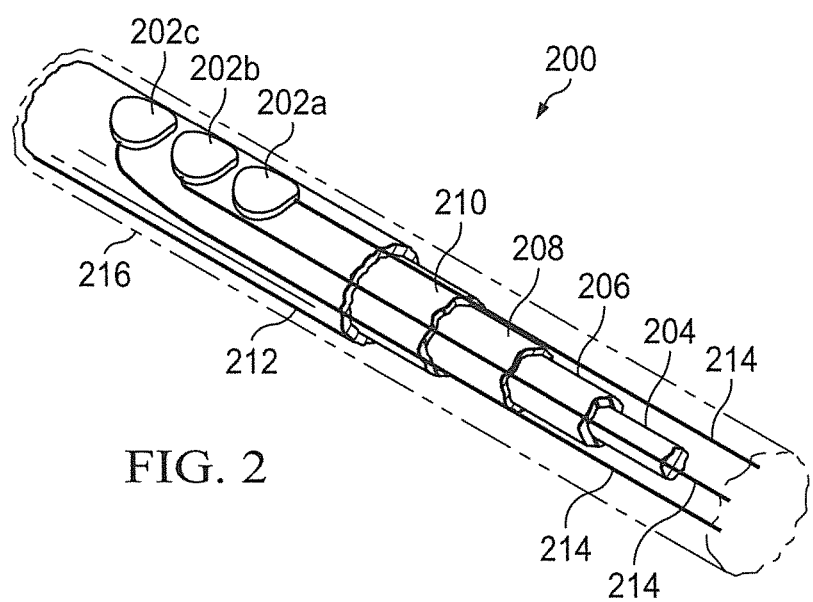
FIG. 2 is an illustration of an illustrative cable having configuration buttons disposed thereon.

With regard to FIG. 2, an illustration of an illustrative cable 200 having configuration buttons 202a-202c (collectively 202) disposed thereon is shown. The configuration buttons 202 may be capacitive pads or capacitive switches that are responsive to capacitance of a human finger, as understood in the art. The cable 200 includes a center core 204 configured to conduct power and/or electronic signals, a dielectric insulator 206 configured to insulate the center core 204, and a metal shield 208 configured to enclose the dielectric insulator 206 and minimize radiation produced by signals or power being conducted by the center core 204. Enclosing the metal shield 208 may be a plastic jacket 210 that is typical of cables, such as flexible cables. In one embodiment, a capacitive layer 212 on which buttons 202 are disposed may cover the plastic jacket 210. The capacitive layer 212 may be composed of a variety of different non-conductive materials. As further shown, each of the buttons 202 may have a conductive line 214 being electrically connected to the buttons 202 and extend along the capacitive layer 212 of the cable 200 to communicate signals (e.g., capacitive variance or levels) in response to a user touching or otherwise engaging the buttons 200. The conductive lines 214 may be integral with the cable 200 that includes the capacitive layer 212, and covered by an outer protective layer 216 that covers the capacitive layer 212 and buttons 202 along with the conductive lines 214. In one embodiment, the outer protective layer 216 is a transparent thermoshrinking tube that may be used to protect the capacitive layer 212 and buttons 202.

It should be understood by those skilled in the art that capacitive touch technology requires an insulating pad or shielding around the conductive lines 214 and the capacitive pads to prevent false touch information. This shielding is to be on the same plane as the conductive lines 214 and buttons 202 if in the form of capacitive pads.

Figure 3:
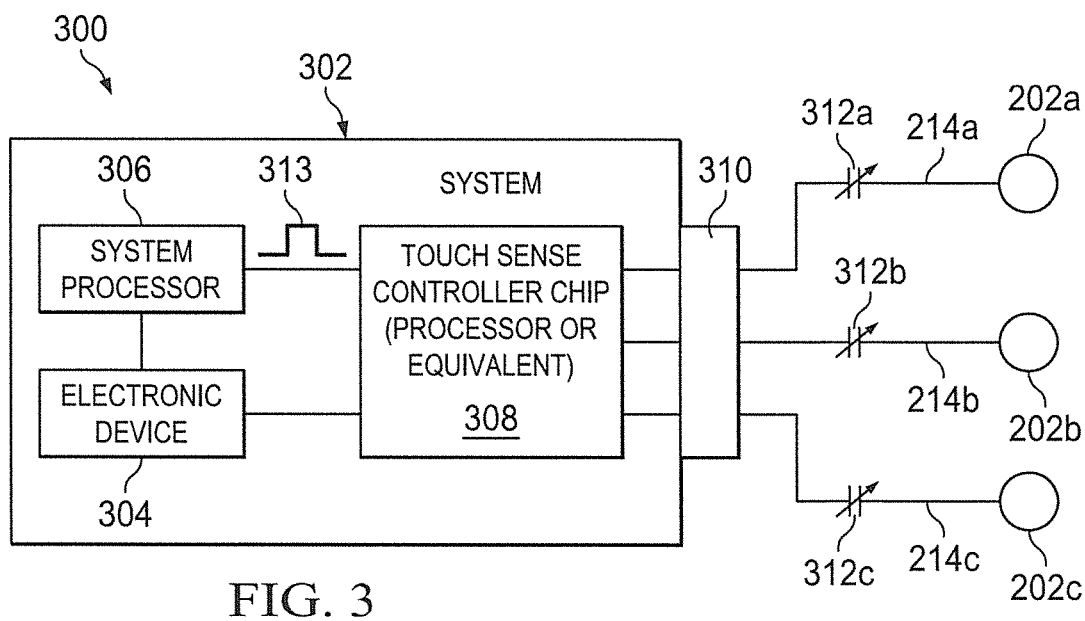
FIG. 3 is an illustration of an illustrative electrical schematic showing buttons deposited on a cable (not shown) in electrical communication with a system inclusive of an electronic device to be configured using the buttons.

With regard to FIG. 3, an illustration of an illustrative electrical schematic 300 showing buttons 202 deposited on a cable (not shown) in electrical communication with a system 302 inclusive of an electronic device 304 to be configured using the buttons 202 is shown. The buttons 202 may be capacitive pads. The buttons 202 are in electrical communication via a communications link, such as conductor lines 214, with the system 302. The system 302 includes a system processor 306 that manages operations of the system 302. As understood in the art, configuration settings of the electronic device 304 is a different function than operations performed by the electronic device 304, as the electronic device 304 is to be configured prior to being used for operations. Although the electronic device 304 may be preconfigured, the electronic device 304 may be re-configured as desired by the user or necessitated over time. The electronic device 304 may be configured for a variety of reasons depending on the functionality thereof. For example, if the electronic device 304 is an image scanner, then the electronic device 304 may be configured to increase or decrease sensitivity, resolution, or any number of scanning parameters.

As further shown, the buttons 202 may be electrically connected to a connector 310 that enables communication signals (e.g., capacitance levels) from the buttons 202 to be communicated with a touch sense controller chip 308, which may be a processor or other electronics. Capacitance variations or levels 312a-312c (collectively 312) may be generated in response to a user operating the buttons by touching the buttons if in the form of capacitance or capacitive pads. For example, if a user touches the button 202a that is configured as a capacitive pad, then a capacitance variation 312a indicative of the user touching the capacitive pad may be communicated along the conductive line 214a to cause the touch sense controller chip 308 to sense the capacitance variation 312a to create a digital information "button pressed" or button released" signal 313. The system processor 306 and/or electronic device 304 may be in communication with the touch sense controller chip 308 to configure the electronic device 304 in response to the touch sense controller chip 308 sensing user interaction with one or more of the buttons 202 configured as capacitance pad(s). Although shown as capacitance variation 312, it should be understood that alternative signal types may be used depending on the type of button utilized.

By having multiple buttons 202, a combination of the signals from the buttons 202 may be used to set one or more configuration settings of an electrical device. In one embodiment, the chip 308 may be configured with a timer that may be used to sense a number of times a button is pressed or touched within a predetermined amount of time (e.g., 3 times within 1 second) and determine a configuration setting value to communicate to the electronic device for setting one or more configuration settings. In one embodiment, the buttons 202 may have a certain length or dimension that enables a user to swipe, place at a certain location (e.g., to the left or right side), or perform other action (e.g., rotate clockwise or counterclockwise around the cable along the buttons 202) to create a capacitive level that indicates to increase, decrease, or set at a certain level, and the chip 308 may be configured to recognize those various actions.

Figure 4:
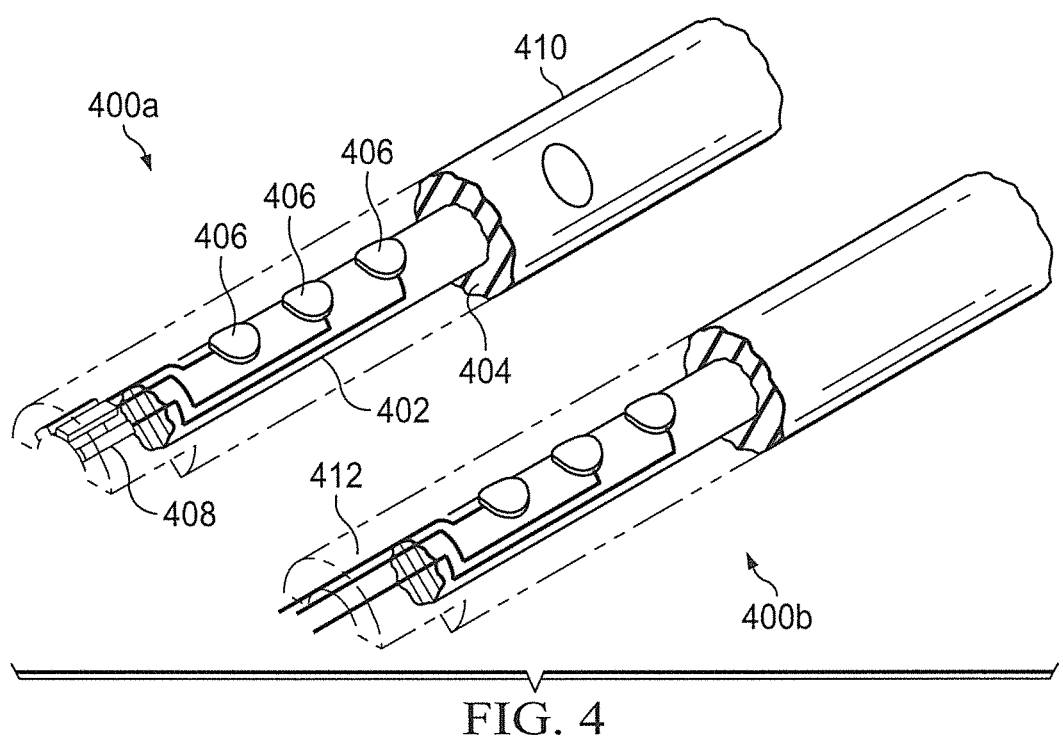
FIG. 4 is an illustration of an illustrative cable in which a standard cable may have an insulating material, which may be a Kapton® curved half-sleeve, added to the standard cable.

With regard to FIG. 4, an illustration of an illustrative cable 400a in which a standard cable 402 may have an insulating material 404, which may be a Kapton® curved half-sleeve (i.e., a half-sleeve formed of Kapton non-conductive material), added to the standard cable 402 is shown. Capacitive pads 406 may be disposed on the insulating material 404. The cable 400a is an alternative embodiment to the integrated cable 200 of FIG. 2 in which the buttons 202 and conductor lines 214 are integrated into the cable 200 itself. As shown, contacts 408 are deposited on the insulating material 404, and an electronic device (not shown) and/or connector (not shown) to a system port (not shown) may be configured with corresponding contacts to be in electrical communication with the pads 406 or other configured buttons. A thermoshrinking material 410 may be disposed over the insulating material 404 and pads 406. In one embodiment, the thermoshrinking material 410 may be transparent such that a user can visibly see the pads 406. An illustrative cable 400b is shown to include conductor lines 412 that do not have contacts, but rather connect to an electronic device connector (not shown), where the electronic device may be an optical scanner or other device configured to be small without a configuration setting mechanism (e.g., DIP switches).

Figure 5:
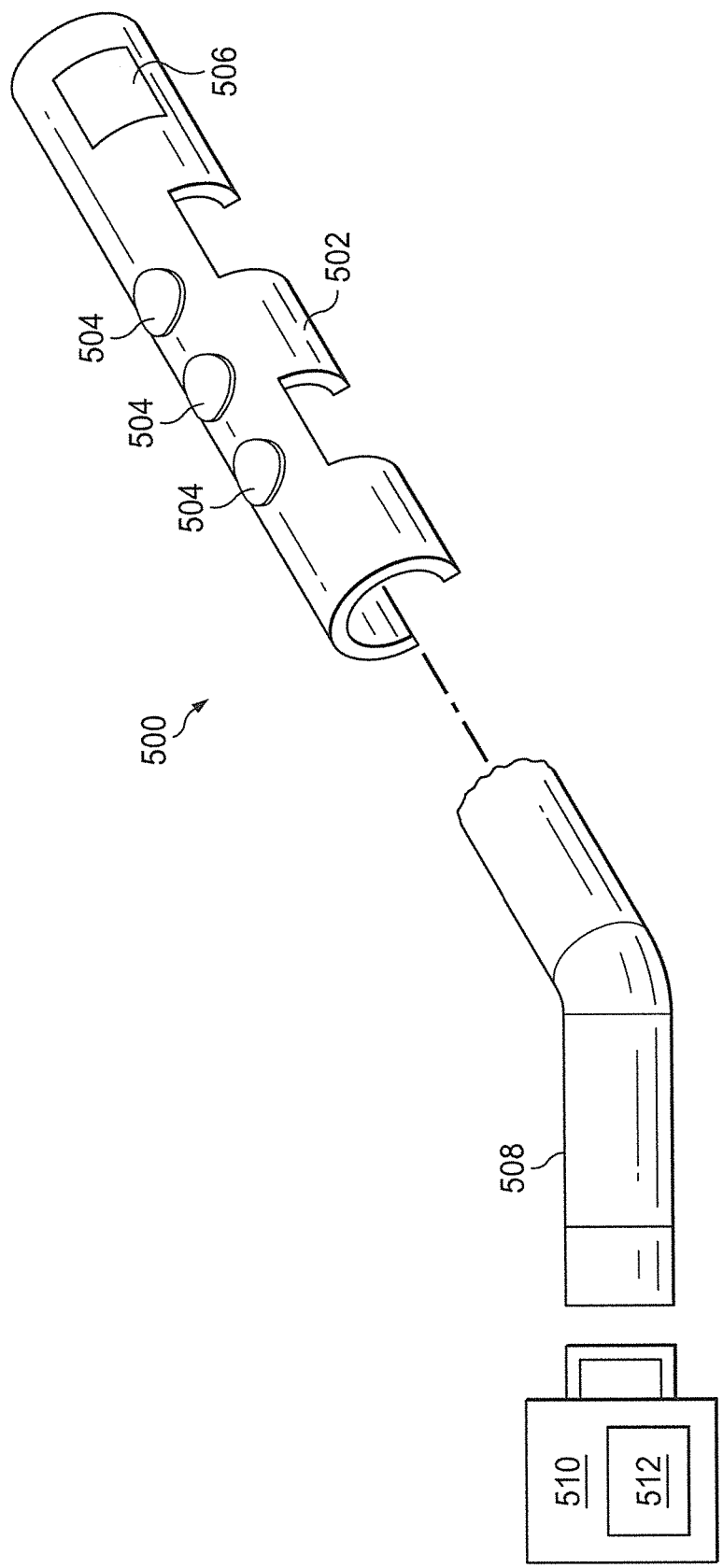
FIG. 5 is an illustration of an alternative embodiment in which an accessory shaped as a half-sleeve jacket inclusive of capacitive pads and a wireless communications device, such as an NFC chip, may be attached to a cable for configuring an electronic device having a corresponding wireless communications device.

With regard to FIG. 5, an illustration of an alternative environment in which an accessory 500 shaped as a half-sleeve jacket 502 inclusive of capacitive pads 504 and a wireless communications device 506, such as an NFC chip, may be attached to a cable 508 for configuring an electronic device 510 having a corresponding wireless communications chip 512 is shown. The accessory 500 may be clamped or otherwise attached to the cable 508. The communications device 506 may be powered by radiation emitted from the cable 508 or from the wireless communications chip 512. Other power sources may be utilized, as well. By using a wireless communications path, a connector configured with contacts and conductor wires may be eliminated. As with the communications path of FIG. 4 that includes conductor lines with contacts 408, the wireless communications device 506 may communicate signals to the electronic device 510. In this embodiment, a touch pad sensor (not shown) included with the half-sleeve jacket 502 may be used to sense touches to the touch pad, and generate electronic signals (e.g., digital signals) for communication via the wireless communications device 506.

In one embodiment, the half-sleeve jacket 502 may also include a bidirectional user interface, such as a visual interface, to provide the user with visual feedback of configuration settings of the electronic device and/or confirm user interaction with the capacitive pads 504. A visual display, such as a flexible OLED display or a set of one or more single or multicolor LEDs, may be used to provide the user with visual feedback of configuration settings of the electronic device. In an alternative embodiment, an audible or other feedback (e.g., vibration) mechanism may be utilized to provide for feedback of the configuration settings of the electronic device. The display or other feedback mechanism may be integrated into the half-sleeve jacket 502 or integrated to communicate (wired or wirelessly) with the electronic device as a standalone device to provide the feedback of the configuration settings and/or button interactions by the user.

The half-sleeve jacket 502 may also be self-powered by means of a small battery to exploit different wireless communication technologies, such as active RFID (e.g., active NFC) communications, Zigbee® wireless communications, or Bluetooth® low energy communications. In general, wireless communications technologies that utilize low power may utilize a battery that may be very small, flat and integrated in the half-sleeve jacket 502. The low power usage may extend battery life, even for a small battery, for years.

Figure 6:
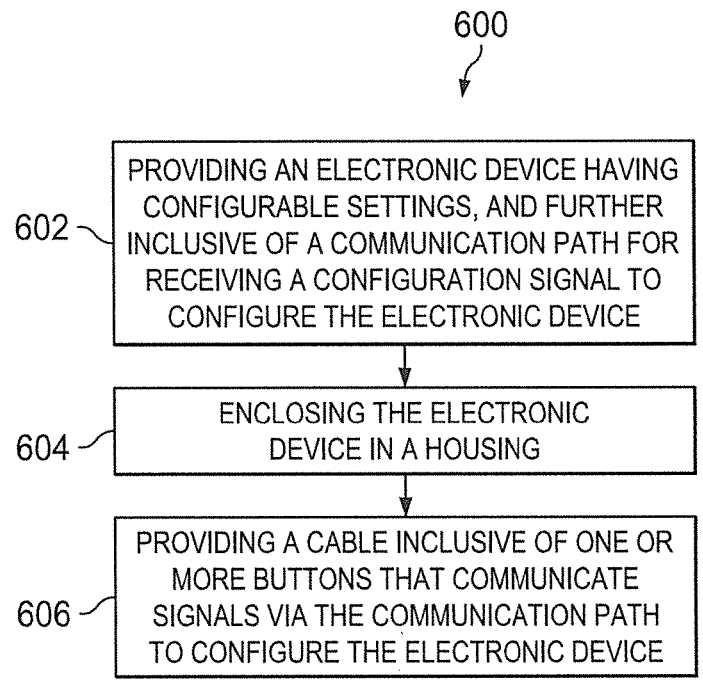
FIG. 6 is a flow diagram of an illustrative process for manufacturing an electronic device using a cable having capacitive pads supported thereby.

With regard to FIG. 6, a flow diagram of an illustrative process 600 for manufacturing an electronic device using a cable having capacitive pads supported thereby is shown. At step 602, an electronic device having configurable settings, and further inclusive of a communications path for receiving a configuration signal to configure a configuration setting of the electronic device may be provided. The electronic device may be a sensor, such as an optical sensor, or any other type of electronic device that is small and has limited space such that configuration switches or buttons are difficult or not possible to include. The electronic device may be enclosed in a housing at step 604. At step 606, a cable inclusive of one or more buttons that communicate signals (e.g., capacitance variance) via the communications path to configure the electronic device may be provided. The buttons may be capacitive pads or switches. In this embodiment, the electronic device does not include hardware (e.g., DIP switches) can be manipulated by a user to set the configurable settings, thereby enabling the electronic device and housing to be smaller than if the hardware were included.

The cable may be configured for plugging into a connector of the electronic device and include conductive lines for communicating signals from the buttons to the electronic device. The cable may be a custom cable with the buttons integrated therewith or be a standard cable with an add-on sleeve or half-sleeve jacket with buttons applied thereto. Rather than the communications path being wired, a wireless communications path may be used to communicate signals from or derived from the buttons on the cable to the electronic device. In another embodiment, the electronic device may be integrated into a system and the cable may be configured to integrate with a connector of the system that identifies signals from the buttons of the cable, and causes those signals to be communicated to the electronic device to configure the electronic device. As previously described, the configuring function of the electronic device is different from operations of the electronic device as operations of the electronic device are performed as a function of the configuration setting.

Figure 7:
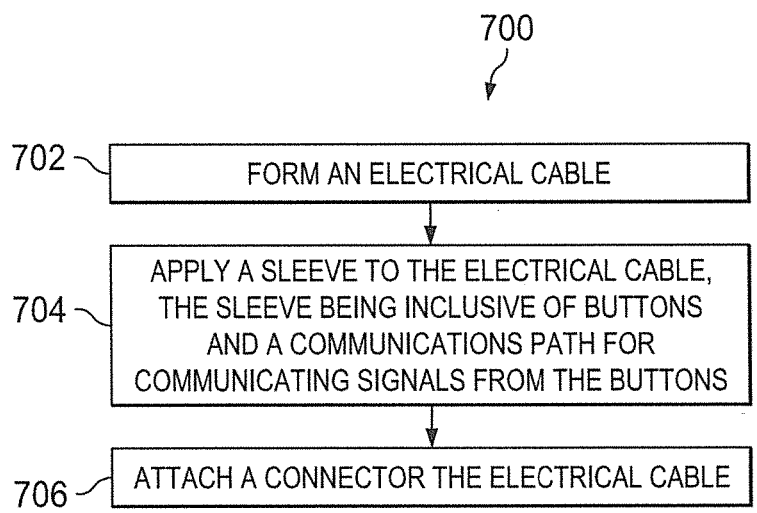
FIG. 7 is a flow diagram of an illustrative process for forming a flexible cable

With regard to FIG. 7, a flow diagram 700 of an illustrative process for forming a flexible cable inclusive of configuration buttons to configure an electronic device is shown. At step 702, an electrical cable may be formed. In forming the electrical cable, a core inclusive of an electrical conductor may be included within an insulator and shield. At step 704, a sleeve may be applied to the electrical cable, where the sleeve may include buttons and a communications path for communicating signals from the buttons. The buttons may be capacitive pads, and the communications path may be electrical conductor lines or a wireless device that communicates the signals wirelessly. The sleeve may be integrated to the cable or be an add-on accessory for the cable. The cable may be a configuration cable that is used for initial configuration of the electronic device or a more permanent cable that may be used for continuous operations of the electronic device or a system in which the electronic device is integrated. At step 706, a connector may be connected to the cable. The connector may be configured to attach to one or more electrical conductors of the cable. In one embodiment, the connector may be configured to include electrical conductor lines from the buttons. The inclusion of the electrical conductor lines may be used to define a custom cable with certain pin(s) including connections to the conductor lines.

The foregoing method descriptions and the process flow diagrams are provided merely as illustrative examples and are not intended to require or imply that the steps of the various embodiments must be performed in the order presented. As will be appreciated by one of skill in the art the steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the principles of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc. The software may be executed locally or remotely over a communications network, such as in the "cloud."

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product. The memory, software, and processing may be local or remotely located over a communications network, such as in the "cloud."

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The previous description is of a preferred embodiment for implementing the invention, and the scope of the invention should not necessarily be limited by this description. The scope of the present invention is instead defined by the following claims.

The invention claimed is:

1. An imaging system, comprising:
an electronic device including an. imager; and
a flexible cable configured to be operably coupled with the imager, the flexible cable including:
an electrical conductor configured to provide power and/or electrical signals to the imager;
a dielectric insulator layer surrounding the electrical conductor;
a shield surrounding the dielectric insulator layer;
a jacket layer being flexible and surrounding the dielectric insulator layer;
a connector electrically connected to the electrical conductor, and configured to connect to the electronic device and communicate the power and/or electrical signals from the electrical conductor to the electronic device;
a capacitive layer engaging the jacket layer; and
at least one capacitive pad disposed on the capacitive layer and configured to communicate configuration signals over a communications path to the electronic device in response to a user touching the at least one capacitive pad with one or more of his or her fingers,
wherein the electronic device is configured to adjust configuration settings of the imager and configure the imager accordingly responsive to the configuration settings received over the communications path responsive to the user touching at least one capacitive pad integrated into the flexible cable.

2. The imaging system according to claim 1, wherein the capacitive layer surrounds the jacket layer.

3. The imaging system according to claim 1, wherein the communications path includes a plurality of conductors that extend along the capacitive layer to the connector.

4. The imaging system according to claim 1, wherein the configuration settings includes a sensitivity parameter or a resolution parameter for the imager.

5. The imaging system according to claim 1, wherein the capacitive switches are respectively configured to generate a first signal in response to the at least one capacitive pad being pressed a first time and a second signal in response to the capacitive switch being pressed a second time.

6. The imaging system. according to claim 1, further comprising a protective layer disposed over the capacitive layer and the at least one capacitive pad.

7. The imaging system according to claim 6, wherein the protective layer is a transparent thermoshrinking tube.

8. The imaging system according to claim 1, wherein the at least one capacitive pad includes a plurality of capacitive pads that are physically distinct from one another, and positioned axially along the capacitive layer.

9. The imaging system according to claim 8, wherein the capacitor pads are separated from one another to enable two fingers two respectively press two capacitive pads.

10. The imaging system according to claim 8, wherein the electronic device is configured to adjust different configuration settings based on different combinations of configuration signals received from multiple capacitive pads selected by the user.

11. The imaging system according to claim 1, wherein the communications path includes a wireless device attached to the flexible cable and configured to wirelessly communicate the signals to the electronic device.

12. The imaging system according to claim 11, wherein the wireless device is configured to communicate the configuration settings to the electronic device via at least one of active RFID or active NFC communication protocols.

13. The imaging system according to claim 1, wherein the jacket layer includes a half-sleeve jacket removable from the cable as a standalone unit.

14. The imaging system according to claim 13, wherein the half-sleeve jacket includes a battery configured to provide power to electronics within the half-sleeve jacket removable from the cable.

15. A method for manufacturing an electronic device, the method comprising:
prov14ng an electronic device including an imager having configuration settings that are different than operational settings, and further inclusive of a communications path for receiving configuration signals;
enclosing the electronic device in a housing; and
providing a cable having one or more buttons integrally formed with the cable that are configured to communicate the configuration signals via the communications path to the electronic device, wherein the electronic device is configured to adjust the configuration settings of the imager and to configure the imager accordingly responsive to the configuration signals received from the cable over the communications path.

16. The method according to claim 15, further comprising integrating a first wireless communications device in the electronic device, the first wireless communications device being configured to receive wireless signals from a second wireless communications device integrated with the cable.

17. The method according to claim 15, further comprising including a connector on the electronic device configured to mate to a connector on the cable, and wherein the connectors form one or more conductive paths that electrically connect to the buttons.

18. A method for operating an imaging system, the method comprising:
receiving an input responsive to a user selecting one or more buttons integrally formed on an electrical cable including an electrical conductor, insulator, and shield and a capacitive layer within the electrical cable;
transmitting one or more configuration signals from the electrical cable over a communication path to an electronic device responsive to the input;
adjusting one or more configuration settings of an imager of the electronic device and configuring the imager accordingly responsive to the one or more configuration signals received by the electronic device.

19. The method of claim 18, wherein adjusting the one or more configuration settings includes selecting a different configuration setting for adjustment depending on a combination of configuration signals received by the electronic device responsive to the user selecting multiple buttons integrally formed on the electrical cable.

* * * * *